United States Patent [19]

Spicer et al.

[11] 3,877,023

[45] Apr. 8, 1975

[54] ANTIGLITCH DIGITAL TO ANALOG CONVERTER SYSTEM

[75] Inventors: Denis Frank Spicer, Richardson; Andrew Christopher Rodger, Dallas, both of Tex.

[73] Assignee: Texas Instruments Incorporated, Dallas, Tex.

[22] Filed: May 21, 1973

[21] Appl. No.: 362,142

[52] U.S. Cl. .......... 340/347 DA; 307/243; 330/30 D

[51] Int. Cl. ........................ H03k 13/02; H03k 17/56

[58] Field of Search ............... 340/347 DA, 347 CC; 307/243, 203; 179/15 A; 318/562; 330/30 D

[56] References Cited

UNITED STATES PATENTS

| | | | |
|---|---|---|---|
| 2,735,091 | 2/1956 | Burkhart | 340/347 DA |
| 3,182,302 | 5/1965 | Horn | 340/347 DA |
| 3,184,734 | 5/1965 | Uren et al. | 340/347 DA |
| 3,604,950 | 9/1971 | Anderson et al. | 307/243 |
| 3,638,131 | 1/1972 | Sarkissian | 307/243 |
| 3,639,781 | 2/1972 | Marley | 179/15 A |

*Primary Examiner*—Thomas J. Sloyan
*Attorney, Agent, or Firm*—Harold Levine; James T. Comfort; Richard L. Donaldson

[57] ABSTRACT

An antiglitch digital to analog converter system is disclosed, wherein the occurrence of "glitch" (i.e., temporary swings to gross error levels in analog output that arise following rapid transitions of the digital inputs) is prevented. The antiglitch digital to analog converter system comprises a pair of digital to analog converters, each of which is adapted to receive digital inputs as from a digital computer, for example, and having analog outputs alternately transmitted by a multiplexer unit. Thus, the analog output of either of the two digital to analog converters is transmitted by the multiplexer unit only when the particular digital to analog converter is in a steady state due to the reception of a new digital input by that digital to analog converter. "Glitch" is prevented in the operation of the system, since the multiplexer unit effectively prevents the transmission of the analog output of either digital to analog converter whenever the digital input to that particular converter is being changed from one value to another.

3 Claims, 2 Drawing Figures

ANTIGLITCH DIGITAL TO ANALOG CONVERTER SYSTEM

Figure 1:
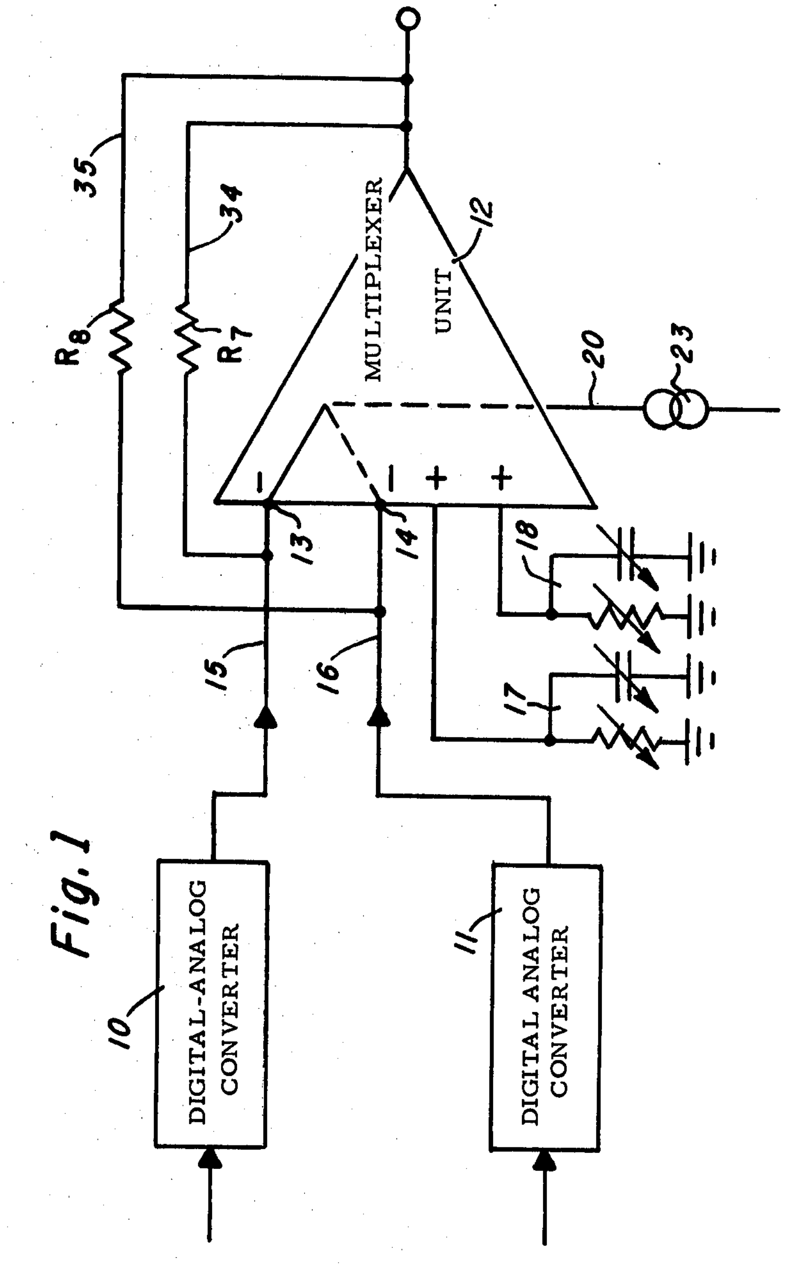

This invention relates to a digital analog converter system, and more particularly to such a system wherein the occurrence of "glitch" (i.e., temporary swings to gross error levels in analog output that arise following rapid transitions of the digital inputs) is prevented.

In the operation of a digital-to-analog converter, the analog output signal therefrom should be proportional to the digital input such that any errors introduced by the converter itself should be linear. The linearity obtainable by a typical 16-bit input digital to analog converter is ± ½ the least significant bit or ±8ppm. However, the dynamic performance of such a typical digital to analog converter suffers when there is a requirement that the digital inputs thereto are such as to rapidly change from one digital input level to another. Ideally, the analog output from such a digital to analog converter should change simultaneously with changes in the digital input thereto. However, in actual practice, a time lag occurs because of the time required to switch the individual digital inputs to the desired new states from their previous states which may cause the analog output level from the digital to analog converter to assume a gross error level for a short period of time before assuming the correct analog output level. For example, in a 16-bit digital to analog converter, the requirement for changing between a state in which the $2^{15}$ bit input is in a "1" condition and all of the other digital inputs are in a "0" condition to a state in which these conditions are reversed creates a situation where the analog output from the converter may swing to the maximum or minimum level depending on the direction of change of the digital input before it assumes the correct analog output level. This phenomenon is referred to as glitch and causes undesirable results in the use of the analog output from a digital to analog converter.

Often, the analog output from a digital to analog converter is transmitted via an operational amplifier to provide a low source impedance voltage output having an increased drive capability as compared with an analog output signal usable directly from the digital to analog converter which acts as a high impedance current source. However, the use of an operational amplifier in conjunction with a digital to analog converter in the manner described may tend to increase the glitch problem such that the output from the operational amplifier may typically take from 13–15 microseconds to settle to within plus or minus one-half of the least significant bit as compared to the analog signal output taken directly from the converter settling in approximately 700 nanoseconds to within plus or minus one-half of the least significant bit.

Such glitches whenever produced are responsible for a poor signal to noise ratio and will be integrated by subsequent amplification stages to cause long settling times.

In accordance with the present invention, a novel antiglitch digital to analog converter system is provided in which the occurrence of glitch is prevented in the analog output signal derived from the system even though continuous digital inputs are being fed into the system in which the digital input levels are constantly changing at high speeds. In this respect, the digital to analog converter system in accordance with the present invention includes a pair of digital to analog converters operated such that the analog output derived from the system is always taken from the one of the pair of digital to analog converters whose analog output is in a steadystate condition. To this end, the pair of digital to analog converters are connected to a multiplexer unit which includes first and second inverting inputs. The system is operated by applying digital inputs alternately to the two digital to analog converters and enabling only one of the inverting inputs corresponding to one of the digital to analog converters at a single time in a continuing sequence so as to pass only the analog output of the digital to analog converter connected to the enabled inverting input through the multiplexer unit. Assuming a digital input has been set up in the first digital to analog converter, for example, and that its associated inverting input in the multiplexer unit has been enabled by a control signal, the other inverting input associated with the second digital to analog converter would then be disabled. Therefore, the multiplexer unit would transmit only the analog output from the first digital to analog converter. When a change in the analog output from the system is required, a fresh digital input is set up in the second digital to analog converter while the inverting input of the multiplexer unit associated therewith remains disabled. The control signal is then switched, disabling the inverting input of the multiplexer unit connected to the first digital to analog converter and enabling the inverting input connected to the second converter. Thus, glitch is prevented in accordance with the present invention, since the multiplexer unit will not pass the analog output of either digital to analog converter when the digital input to that particular converter is being changed from one value to another. When this condition occurs, and a new digital input to one of the digital to analog converters is taking place which might give rise to the occurrence of glitch in the analog output therefrom, the inverting input of the multiplexer unit connected to that converter is disabled to prevent glitch from being transmitted by the multiplexer unit which would otherwise adversely affect the operation of amplifying stages or other electronic circuitry downstream therefrom.

Figure 2:
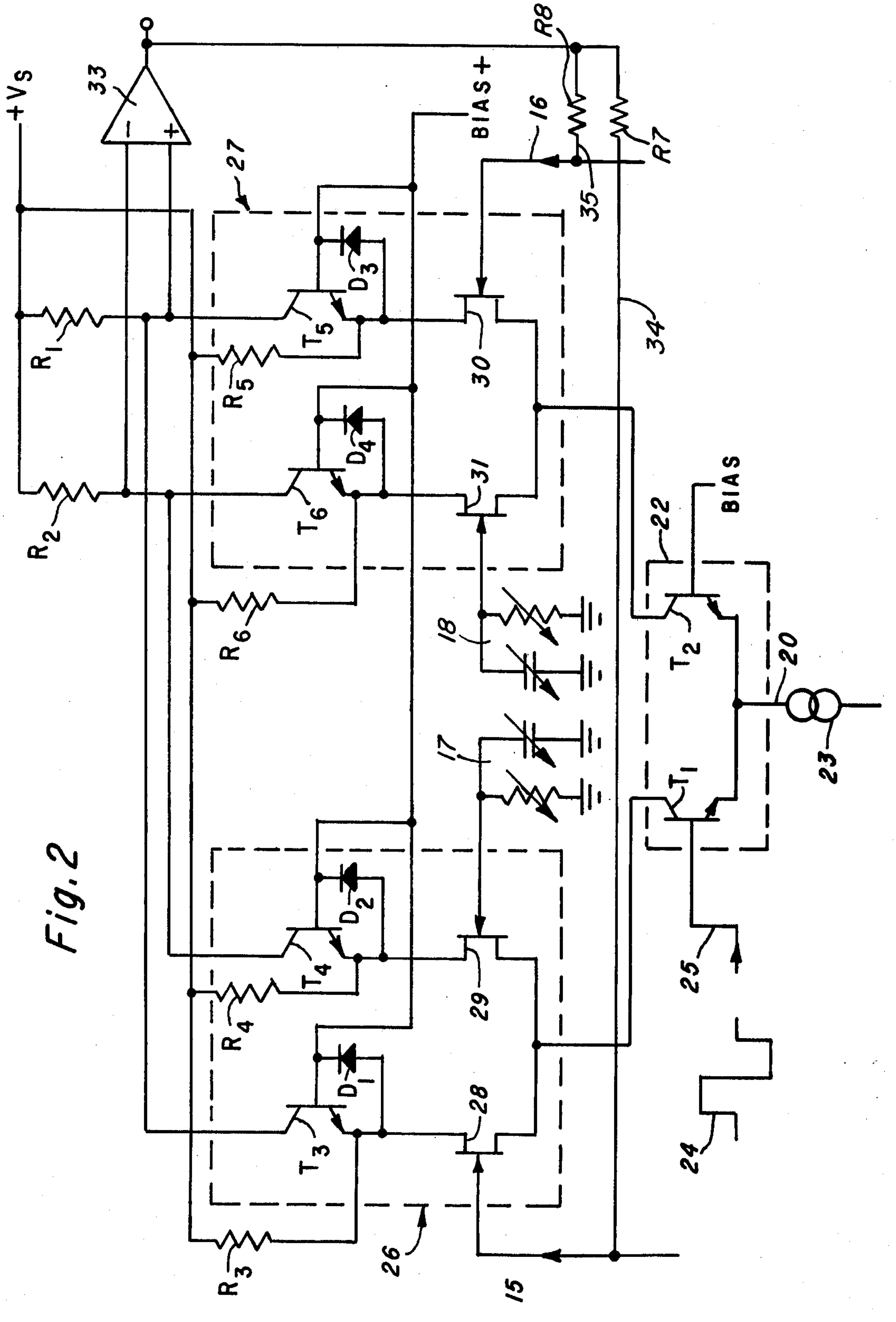

The novel features believed characteristic of this invention are set forth in the appended claims. The invention itself may be further understood by reference to the following detailed description of an illustrative embodiment, when read in conjunction with the accompanying drawings wherein:

FIG. 1 is a diagrammatic view showing the antiglitch digitalanalog converter system as constructed in accordance with the present invention; and FIG. 2 is a schematic electrical circuit diagram of the multiplexer unit forming a component of the antiglitch digital-analog converter system of FIG. 1.

Referring to FIG. 1, an antiglitch digital-analog converter system as constructed in accordance with the present invention as illustrated therein. The system includes a pair of digital-analog converters comprising a first converter 10 and a second converter 11. As a particular example, each of these converters 10, 11 may be a 16-bit digital-analog converter of the type commercially available from Analog Devices of Norwood, Mass., Model No. DAC 16 QM. Each of these converters 10, 11 is adapted to receive a digital input and to produce a proportional analog output therefrom, the digital inputs being applied to the respective converters from a suitable source, such as a general purpose digital computer. Where a single digital-analog converter of the type described is required to change digital inputs applied thereto to proportional analog outputs at a high rate of speed, a problem of glitch may occur in the analog output, especially when the digital input thereto is changing across a major transition. When glitch occurs, the analog output of the converter may be driven to its full scale for a period approximating several hundred nanoseconds, resulting in a poor signal to noise ratio and in integration of each occurring glitch by subsequent amplification stages downstream of the converter causing long settling times before the proper signal appears.

The two digital-analog converters 10, 11 are connected into a multiplexer unit 12 which is so constructed as to alternately transmit the analog output from the first converter 10 and then the second converter 11 such that the analog output transmitted by the multiplexer unit 12 will always be one in a steady-state condition, thereby effectively cancelling glitch from the analog signal being transmitted from the system for subsequent use downstream thereof.

To this end, the multiplexer unit 12 includes first and second inverting inputs 13, 14 to which the first and second digital-analog converters 10, 11 are respectively connected through lines 15, 16. Only one of the two inverting inputs 13, 14 of the multiplexer unit 12 is operable or enabled at any one time, the other inverting input being inoperable or disabled in a manner to be subsequently described by a multiplexer switch device which alternates between the first and second inverting inputs 13, 14 in enabling first one inverting input and then the other for transmission of the analog output signal through the multiplexer unit 12 from the digital-analog converter connected to the enabled inverting input.

In order to obtain accuracy in the transmission of the analog output signals from the digital-analog converters 10 and 11 through the multiplexer unit 12, the multiplexer unit 12 is equipped with respective impedance compensating networks 17, 18 including both resistive and reactive components which may be varied for matching the impedances at the non-inverting inputs of the multiplexer unit 12 with those at the inverting inputs 13, 14 corresponding thereto to maintain an accurate balance between the inverting and non-inverting inputs of the multiplexer unit 12 during a switching phase thereof.

It is further preferred that amplification afforded by the multiplexer unit 12 through an operational amplifier included as a component thereof should have characteristics preventing the inverting input of the multiplexer unit 12 that is in the "off" state or disabled from having any effect on the output from the operational amplifier over the whole range of signal levels which the amplifier will be required to handle.

Thus, it will be understood that the antiglitch digital-analog converter system is operated by applying digital inputs alternately to the two digital-analog converters 10, 11 and transmitting the analog signal outputs therefrom only one at a time by the multiplexer unit 12 depending upon which of the inverting inputs 13, 14 is enabled. Assuming that a digital input has been set up in the first digital-analog converter 10 and a control signal to the multiplexer unit 12 through line 20 causes the inverting input 13 to be enabled, the analog output of the first converter 10 will be passed by the multiplexer unit 12 through the enabled inverting input 13. At the same time, the analog output signal from the second digital-analog converter 11 through line 16 will not be passed by the multiplexer unit 12 because the inverting input 14 to which the second converter 11 is connected is disabled. When a change in the analog output transmitted from the multiplexer unit 12 is required, a new digital input is set up in the second digital analog converter 11 whose corresponding inverting input 14 is still disabled. The multiplexer control signal through the line 20 is then switched to disable the inverting input 13 connected to the first digital-analog converter 10 and to enable the inverting input 14 connected to the second digital-analog converter 11, thereby transmitting only the analog signal output of the second converter 11 through the multiplexer unit 12.

It will be understood that the troublesome problem of glitch is prevented by this system, since the corresponding inverting input 13 or 14 of the multiplexer unit 12 for each of the two respective digital-analog converters 10, 11 will be disabled during the time that the digital input to that converter is being changed from one value to another. The occurrence of glitch in the analog output of such a digital-analog converter when in its transient condition is therefore never transmitted through the multiplexer unit 12, since the analog output of the digital-analog converter in which such glitch occurs will always be blocked by a disabled inverting input of the multiplexer unit 12 and is only passed by an enabled inverting input of the multiplexer unit 12 when it has reached a steady state condition.

Referring now to FIG. 2, a preferred form of the multiplexer unit 12 of FIG. 1 is shown in greater detail and may be said to behave like an operational amplifier used in an inverting configuration. Digital data is only loaded into the first digital-analog converter 10 when the inverting input 14 of the multiplexer unit 12 is enabled such that the analog output of the second digital-analog converter 11 is transmitted by the multiplexer unit 12, and digital data is only loaded into the second digital-analog converter 11 when the aforesaid conditions are reversed. In this way, switching glitches never enter subsequent stages of the electronic circuitry, and the analog output from each digital-analog converter 10, 11 has time to settle while the analog output from the other digital-analog converter is being used. Current output from a digital-analog converter of the 16-bit type referred to will normally settle within less than 1 microsecond. The multiplexer unit 12 is operated by a differential current switch 22 which receives current from a current source 23 along the line 20. A switching voltage 24 is applied through line 25 to the differential current switch 22 to alternately switch between the inverting inputs 13, 14 of the multiplexer unit 12, thereby changing the states of these inputs 13, 14 between "enable" and "disable." The differential current switch 22 may comprise a long tailed pair of transistors $T_1$, $T_2$ which are coupled together by their emitter electrodes as a long-tailed pair.

The input stage of the multiplexer unit 12 comprises a pair of differential cascode amplifiers 26, 27 shown as the circuit configurations included within dotted lines. The differential cascode amplifier 26 includes a pair of high transconductance N-channel field effect transistors 28, 29 whose sources are connected in common to the collector of the transistor $T_1$ in the differential current switch 22. The input to the field effect transistor 28 provides one inverting input 13 of the multiplexer unit 12 and is connected to the analog output of the first digital-analog converter 10 through the line 15. The differential cascode amplifier 26 further includes a pair of transistors $T_3$, $T_4$ connected in a common base configuration and having their respective emitters connected to the drains of the field effect transistors 28, 29 and their collectors connected to a respective pair of load resistors $R_1$, $R_2$ which are connected to a positive voltage supply $+V_s$. The bases of the transistors $T_3$, $T_4$ are positively biased with the transistors $T_3$, $T_4$ having respective diodes $D_1$, $D_2$ interconnected between the base and emitter thereof and resistors $R_3$, $R_4$ respectively connected between the emitters thereof and the positive voltage supply $+V_s$. Thus, the transistors $T_3$, $T_4$ are reverse biased to prevent breakthrough of current thereacross at all times when the differential cascode amplifier 26 is rendered non-conductive. The diode-resistor arrangement $D_1$, $R_3$ and $D_2$, $R_4$ for each transistor $T_3$, $T_4$ prevents inadvertent breakthrough of a residual signal from the pair of field effect transistors 28, 29 which might otherwise occur even though the analog output signal from the digital-analog converter 10 is blocked due to the inverting input 13 of the multiplexer unit 12 being disabled by virtue of the transistor $T_1$ in the differential current switch 22 being non-conductive.

The other differential cascode amplifier 27 is constructed in like manner to the differential cascode amplifier 26, including a pair of high transconductance N-channel field effect transistors 30, 31 whose sources are connected in common to the collector of the transistor $T_2$ in the differential current switch 22. The input to the field effect transistor 30 provides the other inverting input 14 of the multiplexer unit 12 and is connected to the analog output of the second digital-analog converter 11 through the line 16. The differential cascode amplifier 27 further includes a pair of transistors $T_5$, $T_6$ connected in a common base configuration and having their respective emitters connected to the drains of the field effect transistors 30, 31 and their collectors connected to the load resistors $R_1$, $R_2$. The bases of the transistors $T_5$, $T_6$ are positively biased from the same bias line serving the transistors $T_3$, $T_4$ of the differential cascode amplifier 26. Diodes $D_3$, $D_4$ are respectively interconnected between the base and emitter of the transistors $T_5$, $T_6$, and resistors $R_5$, $R_6$ are respectively connected between the emitters thereof and the positive voltage supply $+V_s$. Like the transistors $T_3$, $T_4$ of differential cascode amplifier 26, the transistors $T_5$, $T_6$ are reverse biased to prevent breakthrough of current thereacross at all times when the differential cascode amplifier 27 is rendered non-conductive. The diode-resistor arrangement $D_3$, $R_5$ and $D_4$, $R_6$ for each transistor $T_5$, $T_6$ prevents inadvertent breakthrough of a residual signal from the pair of field effect transistors 30, 31 which might otherwise occur even though the analog output signal from the digital-analog converter 11 is blocked due to the inverting input 14 of the multiplexer unit 12 being disabled by virtue of the transistor $T_2$ in the differential current switch 22 being non-conductive.

The pairs of field effect transistors 28, 29 and 30, 31 of the two differential cascode amplifiers 26, 27 are matched pairs of high transconductance N-channel field effect transistors, with the input to the field effect transistor 28 providing the inverting input 13, while the input to the field effect transistor 30 provides the other inverting input 14 of the multiplexer unit 12. Impedance compensating networks 17, 18 are respectively connected to the non-inverting inputs of the multiplexer unit 12 as represented by the inputs to the field effect transistors 29 and 31, respectively. These impedance compensating networks include variable resistances and variable capacitances to enable the impedances at the non-inverting inputs of the multiplexer unit 12 as provided by the inputs to the field effect transistors 29 and 31 to be accurately matched with the impedances at the associated inverting inputs 13 and 14 provided by the inputs to the field effect transistors 28 and 30 to maintain an accurate balance between the inverting and non-inverting inputs during switching of the multiplexer unit 12 between the two differential cascode amplifiers 26, 27.

The base of the transistor $T_2$ in the differential current switch 22 is suitably biased, while the base of the transistor $T_1$ receives the switching voltage 24 through the line 25 for determining which particular matched pair 28, 29 or 30, 31 of the N-channel field effect transistors is rendered conductive so as to conduct the particular analog output signal of the respective digital-analog converter 10 or 11 associated with the enabled inverting input through the multiplexer unit 12. Thus, the current from the current source 23 directed through the line 20 is alternately switched through either transistor $T_1$ or $T_2$ depending upon whether the switching voltage 24 applied to the base of transistor $T_1$ is "high" or "low" with regard to the bias voltage on the base of the transistor $T_2$. The switching current is thus directed alternately through the collector electrodes of the transistors $T_1$, $T_2$ to either matched pair of N-channel field effect transistors 28, 29 or 30, 31.

Each of the differential cascode amplifiers 26, 27 is connected to an inverting input and a non-inverting input of an output amplifier 33. In this respect, the collectors of transistors $T_4$, and $T_3$ of differential cascode amplifier 26 are connected to the inverting input and non-inverting input of the output amplifier 33 respectively. In like manner, the collectors of the transistors $T_6$ and $T_5$ of differential cascode amplifier 27 are connected to the inverting input and the non-inverting input of the output amplifier 33, respectively.

Referring again to FIG. 1, it will be observed that the output of the multiplexer unit 12 includes a pair of respective feedback lines 34, 35 connected to the output lines 15, 16 of the respective digital-analog converters 10, 11 and including resistors $R_7$, $R_8$ therein, respectively. The analog output from the multiplexer unit 12 as provided by the output amplifier 33 is defined by either resistor $R_7$ or $R_8$ depending upon which inverting input to the multiplexer unit 12 is enabled. The multiplexer unit 12 may be provided with a programmable slewing rate, and assuming that the system is set with the inverting input 13 of the multiplexer unit 12 enabled, the analog output from the multiplexer unit 12 will settle to a value:

$$X_{out} = - I_{out\ 1st} \times R_{S1st},$$

where $I_{out\ 1st}$ is the output current from the converter 10 and $R_{S1st}$ is the sense or feedback resistor $R_7$ connected into the output line 15 of the converter 10. When the control signal 24 changes to cause the differential current switch 22 to switch the control signal through the line 20, the inverting input 14 of the multiplexer unit 12 is then enabled as the inverting input 13 is disabled. Thus causes the analog output $X_{out}$ of the multiplexer unit 12 to slew at a constant rate and to settle at a new value:

$$X_{out} = - I_{out\ 2nd} \times R_{S2nd},$$

where $I_{out\ 2nd}$ is the output current from the converter 11 and $R_{S2nd}$ is the sense or feedback resistor $R_8$ connected into the output line 16 for the converter 11.

One particular application of the present digital-analog converter system is as a component part of a pattern generator for controlling the deflection of an electron beam, such as for example, in the manner disclosed in copending U.S. patent application, Ser. No. 180,776, filed Sept. 15, 1971. One system would control the X-axis deflection, while a second system would control the Y-axis deflection of the electron beam. Such a pattern generator in the production of a mask for the layout of an integrated circuit requires controlled deflection of an electron beam at high speeds and with a high degree of accuracy. The dynamic performance of a standard 16-bit digital-analog converter has been found to be unsatisfactory in such an application involving high speed pattern generation because of glitches occurring in the analog output therefrom. In addition to its application in the pattern generation of a mask for producing an integrated circuit layout, the present antiglitch digital-analog converter system has general application in high speed pattern generation, such as in cathode ray tube displays where high speed digital inputs are converted into analog signal outputs for display.

While this invention has been described with reference to a specific embodiment thereof, it is to be understood that the description is not to be construed in a limiting sense. Various modifications of the disclosed embodiment, as well as other embodiments of the invention, will be apparent to those skilled in the art. Accordingly, it is contemplated that the spirit and scope of the invention will be defined by the appended claims.

What is claimed is:

1. A digital-to-analog converter system comprising first and second digital-to-analog converters;

means for applying digital inputs to said first and second digital-to-analog converters;

multiplexing means connected to the outputs of said first and second digital-to-analog converters and operable to transmit an analog output signal derived alternately from either one of said first and second digital-to-analog converters;

said multiplexing means including respective balanced amplifiers each having a pair of inputs, a first input connected to the outputs of the respective first and second digital-to-analog converters, and a second input connected to respective balance impedance means operable to maintain balance between said first and second inputs of each said balanced amplifier during operation of said multiplexing means;

an output amplifier having a pair of inputs connected in parallel to the respective pairs of outputs of said balanced amplifiers; and respective negative feedback paths connected between the output of said output amplifier and the respective first inputs of said balanced amplifiers;

said control means effective for alternately enabling said first inputs of said balanced amplifiers, said control means including a current source, a differential current switch connected between said current source and said balanced amplifiers, and an alternating signal source connected to said differential current switch for alternately connecting and disconnecting said current source with said respective balanced amplifiers for enablement of the first input of the balanced amplifier to which said current source is connected and disablement of the first input of said balanced amplifier from which said current source is disconnected;

said control means being adapted for synchronization with said digital input applying means for regulating the transmission of the outputs of said first and second digital-to-analog converters by said multiplexing means to prevent transmission of the output of either of said first and second digital-to-analog converters during a period when the digital input thereto is being changed from one value to another.

2. A digital analog converter system comprising first and second digital-to-analog converters;

means for applying digital inputs to said first and second digital-to-analog converters;

multiplexing means connected to the outputs of said first and second digital-to-analog converters and operable to transmit an analog output signal derived alternately from either one of said first and second digital-to-analog converters; respective negative feedback lines connected to the output of said multiplexing means and the corresponding one of the outputs of said first and second digital-to-analog converters;

said multiplexing means including first and second transistor balanced amplifiers each including a first input connected to the outputs of said first and second digital-to-analog converters respectively, said balanced amplifiers further each including a second input and respective impedance compensating networks connected with said second inputs for matching the impedance of said second inputs of said balanced amplifiers so as to maintain balance between said first and second inputs of each said balanced amplifier during operation of said multiplexing means;

and control means effective for alternately enabling said first inputs of said balanced amplifiers, said control means including a current source, a differential current switch connected between said current source and said balanced amplifiers, and an alternating signal source connected to said differential current switch to change the switch between a first switching state wherein it connects the current source to said first balanced amplifier to enable said first digital-to-analog converter to transmit a steady state analog signal from the output of said first digital-to-analog converter while disabling the second balanced amplifier and a second switching state wherein it connects the said current source to said second balanced amplifier to enable the second digital-to-analog converter to transmit a steady state analog signal from the output of the second digital-to-analog converter while disabling said first balanced amplifier;

said control means being adapted for operation to regulate the transmission of the outputs of said first and second digital-to-analog converters by said multiplexing means to prevent transmission of the output of either of said first and second digital-to-analog converters during a period when the digital input thereto is being changed from one value to another.

3. A digital analog converter system comprising first and second digital-to-analog converters;

means for applying digital inputs to said first and second digital-to-analog converters;

multiplexing means connected to the outputs of said first and second digital-to-analog converters and operable to transmit an analog output signal derived alternately from either one of said first and second digital-to-analog converters;

said multiplexing means including an input stage having first and second differential cascode amplifiers respectively associated with said first and second digital-to-analog converters;

each of said first and second differential cascode amplifiers including a pair of field effect transistors having a common source configuration, a first transistor of each pair of field effect transistors having an input connected to the outputs of the first and second digital-to-analog converters respectively; first and second transistors having emitters connected to the drains of the first and second field effect transistors respectively; means for reverse biasing said first and second transistors to prevent current breakthrough when said first and second transistors are in a non-conductive state; balance impedance means connected to the inputs of the second transistor of each said pair of field effect transistors to maintain balance between the first and second inputs of respective field effect transistor pairs during operation of said multiplexing means;

an output amplifier having a pair of inputs; means connecting the collectors of each of said first transistors to one input of said output amplifier; and the collectors of each of said second transistors to the other input of said output amplifier; respective negative feedback lines connected from the output of said output amplifier to the inputs of the first field effect transistors of said first and second differential cascode amplifiers respectively;

and control means effective for alternately enabling said inputs of said first field effect transistors, said control means including a current source, a differential current switch connected between said current source and the common source of said first and second cascode amplifier, and an alternating signal source connected to said differential current switch to change the switch between a first switching state wherein it connects the current source to the common source of said first cascode amplifier to enable said first digital-to-analog converter to transmit a steady state analog signal from the output of said first digital-to-analog converter while disabling the second cascode amplifier, and a second switching state wherein it connects the said current source to common source said second cascode amplifier to enable the second digital-to-analog converter to transmit a steady state analog signal from the output of the second digital-to-analog converter while disabling said first cascode amplifier;

synchronization of said control means with said digital input applying means regulating the transmission of the outputs of said first and second digital-to-analog converters by said multiplexing means to prevent transmission of the output of either of said first and second digital-to-analog converters during a period when the digital input thereto is being changed from one value to another.

* * * * *